United States Patent
Linné et al.

(10) Patent No.: US 8,907,554 B2
(45) Date of Patent: Dec. 9, 2014

(54) ASSEMBLY AND METHOD FOR REDUCING FOIL WRINKLES

(75) Inventors: Ulrika Linné, Lund (SE); Anders Kristiansson, Lund (SE); Krister Kristiansson, legal representative, Lund (SE); Werner Haag, Lugnorre (CH); Toni Waber, Aefligen (CH); Mattias Henriksson, Malmö (SE); Kurt Holm, Baden (CH)

(73) Assignee: Tetra Laval Holdings & Finance S.A., Pully (CH)

( * ) Notice: Subject to any disclaimer, the term of this patent is extended or adjusted under 35 U.S.C. 154(b) by 151 days.

(21) Appl. No.: 13/574,489

(22) PCT Filed: Feb. 1, 2011

(86) PCT No.: PCT/SE2011/050102
§ 371 (c)(1),
(2), (4) Date: Oct. 26, 2012

(87) PCT Pub. No.: WO2011/096874
PCT Pub. Date: Aug. 11, 2011

(65) Prior Publication Data
US 2013/0094993 A1    Apr. 18, 2013

Related U.S. Application Data (60) Provisional application No. 61/304,298, filed on Feb. 12, 2010.

(30) Foreign Application Priority Data

Feb. 8, 2010    (SE) ...................................... 1000115

(51) Int. Cl.
    H01J 33/04    (2006.01)
    H01J 37/16    (2006.01)
    H01J 9/26     (2006.01)

(52) U.S. Cl.
    CPC ........... *H01J 33/04* (2013.01); *H01J 2237/164* (2013.01); *H01J 9/263* (2013.01); *H01J 37/16* (2013.01)

USPC .............. 313/420; 422/45; 378/140; 378/161

(58) Field of Classification Search
None
See application file for complete search history.

(56) References Cited

U.S. PATENT DOCUMENTS

| | | | |
|---|---|---|---|
| 3,607,680 A | * | 9/1971 | Uno et al. ..................... 205/122 |
| 4,333,036 A | | 6/1982 | Farrell |

(Continued)

FOREIGN PATENT DOCUMENTS

| | | |
|---|---|---|
| CN | 85108631 B | 4/1988 |
| CN | 1663012 A | 8/2005 |

(Continued)

OTHER PUBLICATIONS

International Search Report (PCT/ISA/210) issued on May 10, 2011, by the Swedish Patent Office as the International Searching Authority for International Application No. PCT/SE2011/050102.

(Continued)

*Primary Examiner* — Ashok Patel
(74) *Attorney, Agent, or Firm* — Buchanan Ingersoll & Rooney PC (57) ABSTRACT

An assembly of a support plate and an exit window foil for use in an electron beam generating device. The support plate is designed to reduce wrinkles in the foil. The foil is bonded to the support plate along a closed bonding line bounding an area in which the support plate is provided with a pattern of apertures and foil support portions alternately. When vacuum is created in the housing the pattern is adapted to form a topographical profile of the foil substantially absorbing any surplus foil. Another aspect involves a method in a filling machine for sterilizing a packaging material web.

12 Claims, 7 Drawing Sheets

(56) References Cited

U.S. PATENT DOCUMENTS

| | | |
|---|---|---|
| 4,591,756 A | 5/1986 | Avnery |
| 5,235,239 A | 8/1993 | Jacob et al. |
| 5,561,342 A | 10/1996 | Roeder et al. |
| 2003/0001108 A1 | 1/2003 | Rangwalla et al. |
| 2004/0222733 A1* | 11/2004 | Avnery et al. ............... 313/495 |
| 2008/0143235 A1 | 6/2008 | Avnery et al. |
| 2009/0173897 A1* | 7/2009 | Decker et al. ............. 250/505.1 |
| 2011/0266942 A1* | 11/2011 | Avnery et al. ............... 313/420 |
| 2013/0000253 A1* | 1/2013 | berg et al. ..................... 53/425 |
| 2013/0009540 A1* | 1/2013 | Avnery et al. ............... 313/420 |
| 2013/0051535 A1* | 2/2013 | Davis et al. .................. 378/161 |

FOREIGN PATENT DOCUMENTS

| | | |
|---|---|---|
| DE | 138 588 A1 | 11/1979 |
| EP | 0 195 153 B1 | 6/1985 |

OTHER PUBLICATIONS

Supplementary European Search Report dated Jul. 25, 2013, issued by the European Patent Office in the corresponding European Application No. 11 74 0107. (2 pages).

Jaynes et al., "Scalloped Hibachi and Vacuum-Pressure Foil for Electra: Electron Beam Pumped KrF Laser", Pulsed Power Plasma Science Conference, IEEE, 2007, pp. 826-830.

* cited by examiner

ASSEMBLY AND METHOD FOR REDUCING FOIL WRINKLES

The present invention refers to an assembly and a method for reducing wrinkles in an electron exit window foil of an electron beam generating device, which wrinkles may arise due to surplus foil arising in the assembly process, and which foil is bonded to a support plate.

BACKGROUND OF THE INVENTION

Electron beam generating devices may be used in sterilization of items, such as for example in sterilization of packaging material, food packages or medical equipment, or they may be used in curing of e.g. ink. Generally, these devices comprise an electron exit window assembly formed by at least a foil and a support plate. The support plate, which is preferably made of copper, has a plurality of apertures through which the electrons will be exited from the electron beam generating device during operation. The support plate forms a wall of a vacuum-tight housing of the electron beam generating device, and to sustain the vacuum the support plate apertures are covered by a foil. Said foil has a thickness of around 6-10 μm and is preferably made of titanium. Due to the thinness most of the electrons are able to pass through it.

The foil is sealed to the support plate at or near its circumference by bonding. The term bonding should here be interpreted as a general term. Possible bonding techniques may be laser welding, electron beam welding, brazing, ultrasonic welding, diffusion bonding and gluing.

During the delicate handling of the foil in the assembly process surplus foil may arise, for example due to the foil being stretched or in other ways. As the foil and the support plate are fixed to each other at the bonding line, the surplus foil may cause wrinkles in the foil upon application of vacuum in the housing. Large wrinkles are detrimental for the operation of the electron beam generating device, not only because of the reduced efficiency to let electrons pass, but also because of the risk of cracks arising along the wrinkles. The foil is indeed very fragile.

SUMMARY OF THE INVENTION

Therefore, an object of the invention has been to provide an assembly of a support plate and an exit window foil, the support plate being designed to efficiently and carefully reducing wrinkles in the foil.

The object is achieved by an assembly of a support plate and an exit window foil for use in an electron beam generating device, said support plate being designed to reduce wrinkles in said foil, which wrinkles may arise due to surplus foil arising in the assembly process, said foil being bonded to the support plate along a closed bonding line bounding an area in which the support plate is provided with apertures and foil support portions and in which area the foil is adapted to serve as a portion of a wall of a vacuum tight housing of the electron beam generating device. Said assembly is characterized in that the support plate, within said area, is provided with a pattern of apertures and foil support portions alternately, which pattern, when vacuum is created in the housing, is being adapted to form a topographical profile of the foil substantially absorbing any surplus foil.

It is important to realize that surplus foil arising from for example foil stretching need to be taken care where arising. The support plate and the foil are connected to each other at the bonding line, and any motion between the foil and support plate that can cause an accumulation of surplus foil in some areas, will possibly also cause wrinkles. Hence, the surplus foil needs to be absorbed as much as possible directly down into the support plate, i.e. in a direction perpendicular to the plane of the support plate. Hence the foil may be controlled not to significantly move in relation to the support plate in a direction of the plane of the support plate. The wording absorb is here and in the following used to signify that the foil should be received on a profiled surface in such a way that any extra foil area is allowed to bulge downwards in a controlled way to create a "tensioned" foil. The wording tensioned is here and in the following used to signify that the foil is not able to form large, uncontrollable wrinkles when vacuum is created in the housing. However, the foil is not tensioned in the meaning that there is caused extensive stress in the foil.

In a presently preferred embodiment of the assembly the absorption is made in such a way that a substantially dominant bending of the foil occurs in said apertures. It has been realized that the pattern of the support plate should facilitate single-curving of the foil and to avoid double-curving as much as possible. It has been found that harmful wrinkles are more likely to occur in areas where the foil is considerably double-curved. In the invention double-curving is reduced to a large extent by giving the foil a dominant bending in each aperture. The wording dominant bending is here and in the following defined as essentially single-curving, or single-curving comprising a minor or small contribution of double-curving. It is difficult to completely eliminate double-curving of the foil, but if the foil is forced to bulge or bend as much as possible in one direction, thus creating a dominant bending in that direction, the effects of additional, smaller, bending in any other directions can be reduced. The dominant bending applies both for how it is desired that the foil should bend locally, in each single aperture of the support plate, but also how it is desired that the foil should bend globally, that is, over a number of neighboring apertures.

Further presently preferred embodiments of the invention are described in the dependent claims 3-12.

The invention also comprises a method for reducing wrinkles in an exit window foil of an electron beam generating device, which wrinkles may arise due to surplus foil arising in the assembly process, said foil being bonded to a support plate along a closed bonding line bounding an area in which the support plate is provided with apertures and foil support portions and in which area the foil is adapted to serve as a portion of a wall of a vacuum tight housing of the electron beam generating device. The method comprises the step of providing, within said area, a pattern of apertures and foil support portions alternately in the support plate, which pattern, when vacuum is created in the housing, is being adapted to form a topographical profile of the foil substantially absorbing any surplus foil.

The invention further comprises a method in a filling machine for sterilizing packaging material such as for example a packaging material web. The method comprises the step of using an electron beam generating device comprising an assembly according to claim 1.

BRIEF DESCRIPTION OF THE DRAWINGS

In the following, presently preferred embodiments of the invention will be described in greater detail, with reference to the enclosed drawings, in which.

In the different embodiments the same reference numerals have been used for similar features.

DESCRIPTION OF PREFERRED EMBODIMENTS

Figure 1:
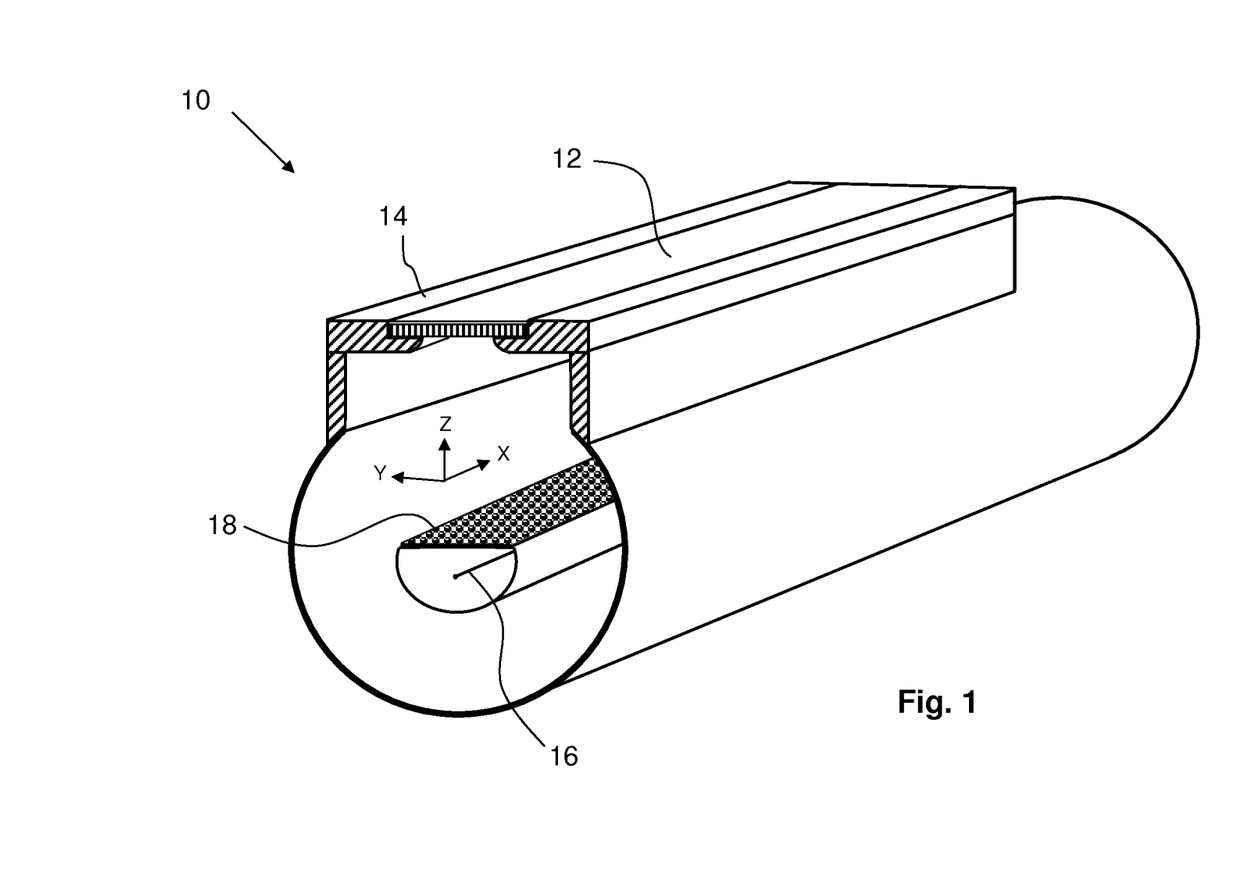
FIG. 1 shows a schematic cross section of an electron beam generating device according to prior art.

FIG. 1 shows a very schematic view of an example of an electron beam generating device 10. The device comprises an electron exit window 12 through which electrons are transmitted towards a target to be irradiated. In accordance with the disclosed design the electron beam generating device 10 generally comprises a vacuum chamber 14 in which a filament 16 and a control grid 18 is provided. The filament 16 is preferably made of tungsten. When an electrical current is fed through the filament 16, the electrical resistance of the filament causes the filament to be heated to a temperature in the order of 2000° C. This heating causes the filament 16 to emit a cloud of electrons. The control grid 18 is provided in front of the filament 16 and helps to distribute the electrons in a controlled manner. The electrons are accelerated by a voltage between the grid 18 and the exit window 12. The electron beam generating device 10 is generally denoted low voltage electron beam emitter, which emitter normally has a voltage below 300 kV. In the disclosed design the accelerating voltage is in the order of 70-85 kV. This voltage results in kinetic (motive) energy of 70-85 keV in respect of each electron.

Figure 2:
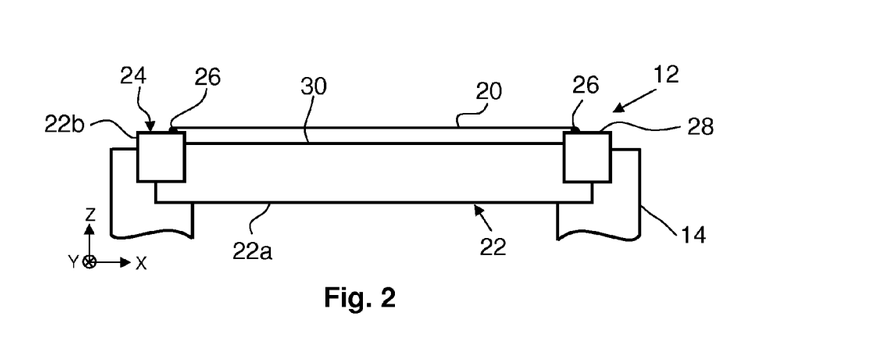
FIG. 2 shows a schematic cross section of a first embodiment of an assembly according to the invention, which assembly is mounted to a partly shown housing of an electron beam generating device.

The electron exit window 12, as shown in FIG. 2, is an assembly of a support plate 22 and an electron exit window foil 20. The foil 20 is attached to an outer surface 24 of the support plate 22, which in FIG. 2 is seen as an upper surface of the support plate 22. Thus, the support plate 22 is provided on the inside of the foil 20, i.e. the foil 20 is facing the surroundings whereas the support plate 22 is facing towards the inside of the electron beam generating device 10.

The attachment of the foil 20 to the support plate 22 is made along a continuous bonding line 26 (only shown as two points in the figure). The bonding line 26, in its entirety, and the area bounded by it, is represented by a dashed line in FIG. 3, which figure shows the assembly of FIG. 2. In a preferred embodiment the support plate 22 and the foil 20 are substantially rectangular and the bonding line 26 is bounding an area having a substantially similar shape. The area will be referred to as a rectangle, but as can be seen from the drawings, the area has a substantially rectangular shape with rounded corners. The rectangle has a first side 1 and a second side 2 opposite the first side 1. Further, the rectangle has a third side 3 and a fourth side 4 opposite the third side 3. The sides within each respective pair are substantially parallel. The first and second sides 1, 2 are substantially perpendicular to the third and fourth sides 3, 4.

Possible techniques for bonding the foil 20 to the support plate 22 may be for example laser welding, electron beam welding, brazing, ultrasonic welding, diffusion bonding and gluing. The bonding line 26 is continuous to be able to maintain vacuum inside the electron beam generating device 10. The word "continuous" is used to define that the line is endless or closed.

The foil 20 is substantially transparent to electrons and is preferably made by a metal, for example titanium or by a sandwich structure of several materials. The thickness of the foil 20 is in the order of about 6-10 μm.

The support plate 22 serves as a support for the foil 20. In the shown embodiment the support plate 22 comprises two members, a first support plate member 22a supporting a central portion of the foil 20 and a second support plate member 22b, having the shape of a frame, provided with the foil bonding line 26. The word "frame" should here be interpreted as an element having a central hole configuration. Further, it should be defined that the bonding line 26 extends along the hole configuration of the frame but within the perimeter of the frame. Preferably, the bonding line 26 extends at a distance from the perimeter of the frame.

Furthermore, at least one bonding line 26 is made. Thus, two or more bonding lines may be made. For example, an inner and an outer bonding line may be made on the frame, and the two lines may, for instance, be concentric with each other.

In an assembled state the two support plate members 22a and 22b are bonded to each other. The two members may be manufactured from different materials, or from a similar material. In a presently preferred embodiment the first support plate member 22a is made of copper or aluminum and the second support plate member 22b is made of stainless steel.

Figure 3:
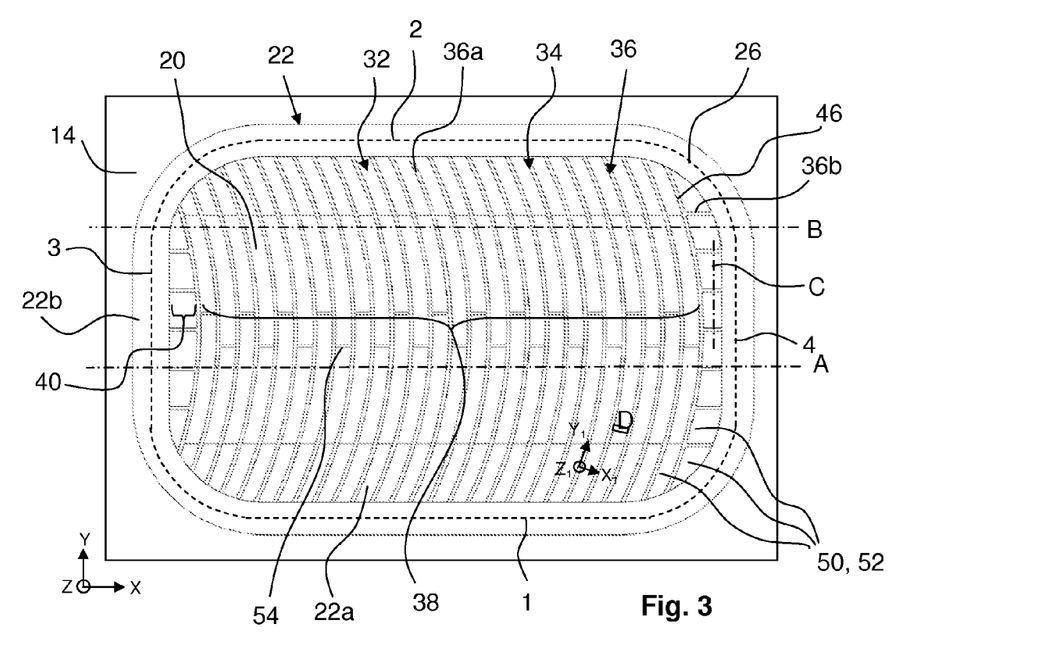
FIG. 3 shows a schematic top view of the embodiment of FIG. 2.

In FIGS. 2 and 3 also the vacuum chamber housing 14 is partly shown, to which the support plate 22 is attached.

As can be seen in FIG. 2 the bonding line 26 is positioned on a plateau 28. The second member 22b of the support plate, i.e. the frame, is positioned in such a way in relation to the first support plate member 22a that the upper surface of the frame forms the plateau 28, i.e. it forms a surface positioned at a higher level than, meaning elevated from, an upper surface 30 of the first support plate member 22a.

A first embodiment is shown in FIGS. 3-9.

The first support plate member 22a is provided with a plurality of apertures 32, some of which are through-going so that electrons can pass. Further, the support plate 22 is provided with foil support portions 34. The foil support portions 34 have top surfaces which are designed to be in contact with the foil 20 when there is provided vacuum in the electron beam generating device 10. Within the area bounded by the bonding line 26 the support plate 22 is provided with a pattern of these apertures 32 and foil support portions 34 alternately, which pattern, when vacuum is created in the housing 14, is being adapted to form a topographical profile of the foil 20 substantially absorbing any surplus foil. By absorbing the surplus foil, wrinkles may be avoided or at least reduced to a large extent. The wording "topographical profile" is used to describe that the foil 20 will have a non-planar, profiled surface where some areas or points are being elevated and some areas or points being countersunk in relation to each other.

In the presently preferred embodiments, the pattern of apertures 32 and foil support portions 34 is designed in such a way that in the apertures 32 a dominant bending of the foil 20 occurs. The area bounded by the bonding line 26 is, in this embodiment, divided in three sections, wherein each such section comprises several apertures 32. In each such section the dominant bending is created in the same direction in neighboring apertures 32. This will be described in more detail in the following in relation to the design of the support plate 22.

In the first embodiment the foil support portions 34 of the first support plate member 22a are formed as foil support bars 36. A first set of foil support bars is provided in a first section 38 of the area, this first section being a central section of the first support plate member 22a. In the following these bars will be denoted first support bars 36a. A second set of support bars is provided in a second side section 40 of the first support plate member 22a, wherein such a second side section 40 is provided one on each side of the first central section 38. In the following these bars will be denoted second support bars 36b.

In FIG. 3 a three dimensional coordinate system has been added. A first axis of the coordinate system, denoted Y, defines a general direction and is directed perpendicular to the first and second sides 1, 2 of the rectangle constituting the area bounded by the bonding line 26. A second axis, denoted X, defines another general direction and is directed perpendicular to the third and fourth sides 3, 4 of the rectangle. The support bars 36a of the first set of support bars extend along the first axis Y and the support bars 36b of the second sets of foil support bars extend along the second axis X. This means that the respective support bars will have their lengthwise extension following the respective axis. It will be shown that these axes are to be interpreted as general, and that the support bars in the preferred embodiment have their actual extension along more specific and local axes.

A third axis, denoted Z, defines an additional general direction constituting the depth of the assembly.

The first support bars 36a extend along curved paths. The curved paths are substantially equal in shape and formed as arcs. There are equal distances between the arced support bars 36a and they are all directed in the same direction so that the distance between two arcs are not varying in the second direction X. Further, foil supporting top surfaces 42 of these first support bars 36a are equal in height in the third direction Z. Said height is being less than the height of the top surface of the plateau 28 at which the foil 20 is bonded. This can be seen in FIGS. 6 and 7.

When in operation the electron beam generating device 10 will be heated, and consequently also the foil support plate 22. The first support bars 36a are arc-formed to control any potential change in shape due to heat expansion, that is, any uncontrolled warping or buckling of the first support bars 36a will be prevented. When heated any heat expansion in the material will give rise to forces in the support bars 36a which may make the support bars start warping. By providing arc-formed support bars 36a the forces will directly have a component in the second direction X, which will facilitate further "bending" in that direction, i.e. the bars will be even more arced.

As previously mentioned the second support bars 36b are provided in a second outer, side section 40 of the first support plate member 22a, one on each side of the first set of support bars 36a. Further, the second support bars 36b extend along the second axis X. Furthermore, they are substantially straight, substantially parallel with each other and preferably equally distributed in the second sections 40 such that there are equal distances between them. However, other distributions and unequal distances are of course also possible. Their supporting top surfaces 44 are sloping, see FIGS. 4-7. The sloping is made such that the support bars 36b have their lowest height in the vicinity of the first support bars 36a and their highest height in vicinity of the bonding line 26. The lowest height of the top surface 44 is being less than the height of the top surfaces 42 of the first support bars 36a. The highest height of the top surface 44 is being less than the height of the top surface of the plateau 28, i.e. the top surface of the plateau 28 is the uppermost surface of the support plate 22.

In a small interface area, denoted third section, between the first section and each respective second section there is provided a support bar 46 having a shape and extension similar to the arc-formed first support bars 36a. In the following this support bar 46 is denoted third support bar 46. Its top surface 48 is situated at a lower level than the top surfaces 42 of the first support bars 36a. The second support bars 36b are connected with this third support bar 46, and the top surface 48 of this third support bar 46 is at a level equal to that of the lowest side of the sloping top surfaces 44 of the second support bars 36b.

As previously mentioned apertures 32 are provided in between the support bars 36. In a first central area in between the first support bars 36a the apertures 32 are through-going, i.e. the apertures 32 extend all the way through the support plate 22 in order for the support plate 22 to be transparent to electrons. However, around the periphery of the first support plate member 22a the apertures 32 are not through-going. Instead the support bars 36, 46 are here connected to each other by an interconnection area 50 having a top surface 52 which is countersunk in relation to all the top surfaces 42, 44, 48 of the support bars 36, 46. The distance between the top surfaces 42, 44, 48 of the support bars 36, 46 and the top surface 52 of the interconnection area 50 is large enough to make sure that the foil 20 will not come into contact with the interconnection area 50.

Figure 4:
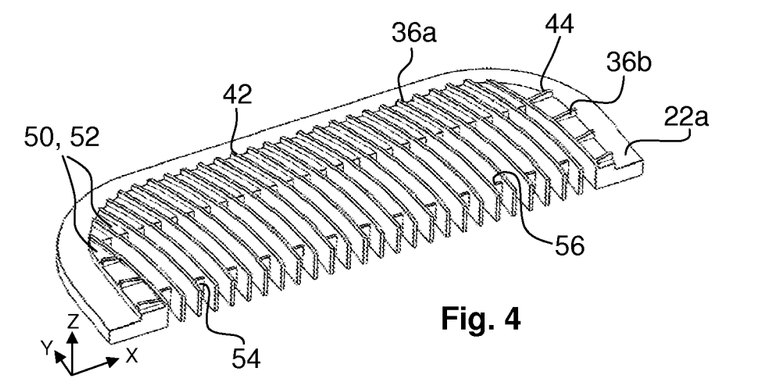
FIG. 4 shows an isometric partly cross sectional view of the support plate of the embodiment of FIGS. 2 and 3.

As mentioned the interconnection area 50 extends around the periphery of the first support plate member 22a. In FIGS. 3 and 4 it can be seen that the interconnection area 50 extends not only in between the second support bars 36b and the third support bar 46, but also in between the ends of the first support bars 36a.

Further, in the central area of the first support bars 36a, where the apertures 32 are through-going, there is provided thin interconnecting portions 54. From FIGS. 4-7 it can be seen that these interconnecting portions 54 have top surfaces 56 having a smaller height than the height at which the top surfaces 42 of the first support bars 36a are situated. The distance, along the third direction Z, between the top surfaces 42 of the first support bars 36a and the top surface 56 of the interconnecting portions 54 is large enough to make sure that the foil 20 will not come into contact with the portions. The function of the interconnecting portions 54 is to maintain the same distance between all the first support bars 36a.

The thin interconnecting portions 54 have their lengthwise extension in the second direction X, see FIG. 3, but not in a straight, central line, instead they are displaced a distance in the first direction Y from a (not shown) imaginable centre line. Every second portion is displaced towards the first side 1 of the support plate 22 and the rest are displaced towards the second side 2, forming a zigzag line. By forming a zigzag line instead of a straight line along the second direction X it is possible to prevent buckling, i.e. a straight line of interconnecting portions 54 would create a bar extending in the second direction X, which bar would be subject to potential buckling.

The thickness of the arc-formed support bars 36a in the second direction X is about 0.55 mm and the thickness in the first direction Y of the substantially centrally positioned interconnecting portions 54 is about 0.4 mm. The thickness of the third support bar 46, in the second direction X, is about 0.55 mm. The thickness of the second support bars 36b, in the first direction Y, is about 0.55 mm.

In the following, with regard to FIGS. 5-8, it will be described how the foil 20 will be received in the support plate 22 upon application of vacuum from the inside of the electron beam generating device 10. When vacuum is applied the apertures 32 and foil support portions 34 will form a topographical profile of the foil 20 substantially absorbing any surplus foil that would otherwise cause damageable wrinkles.

In general it is preferred that the foil 20 should bulge inwards in the apertures causing a substantially dominant bending of the foil 20 around an axis directed substantially perpendicular to the bonding line 26 in a virtual plane of the support plate 22. This means that, since the bonding line is substantially rectangular in the preferred embodiment, the direction of the dominant bending will preferably differ in the first and second sections 38, 40. In the first section 38, the foil 20 will bulge inwards in the apertures 32 between the support bars 36a causing a substantially dominant bending of the foil 20 around the first axis Y. In the second side sections 40 the substantially dominant bending between the support bars 36b will be around the second axis X.

The bulging, or absorption, of the foil 20 will in both cases be made in the negative direction along the third axis Z.

Hitherto, it has been generally described that the dominant bending in the first section 38 is made around the first axis Y. However, it is to be understood that this is somewhat a simplification of the reality. The first support bars 36a are arc-formed and the dominant bending will be made along an axis following the shape of the arc. This axis may be represented by the axis $Y_1$ of an arbitrary local coordinate system, see FIG. 3. The direction of the axis $Y_1$ will follow the shape of the arc and will thereby differ in every point along the arc. The axis $Y_1$ should be seen as a small modification of the more general axis Y.

Figure 9:
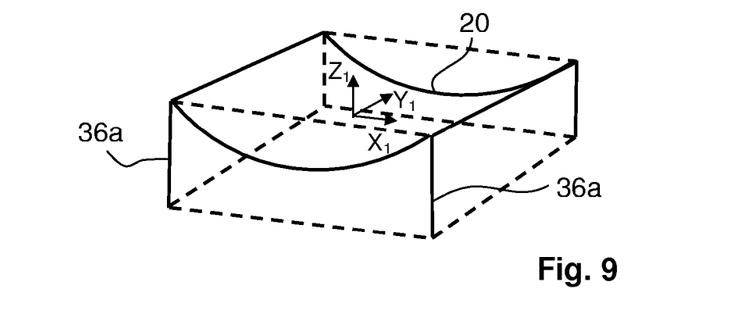
FIG. 9 shows the dominant bending in a small representation D from FIG. 3.

FIG. 9 shows the dominant bending of the foil in a small representation D from FIG. 3. It very schematically shows a volume in the aperture between two support bars. The foil has a dominant bending around the axis $Y_1$ and is bulging downwards, i.e. in a direction along the third axis Z.

Figure 8:
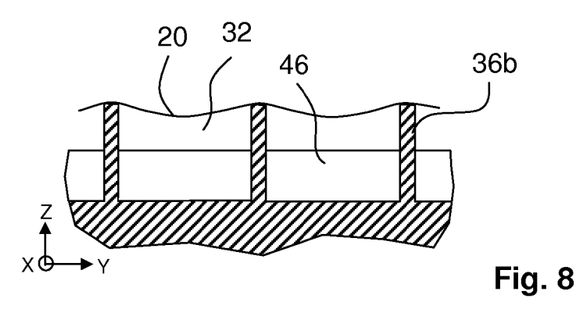
FIG. 8 shows a very schematic representation of a partial cross section taken along line C in FIG. 3 showing a couple of support bars from the second set of support bars and the foil.
Figure 10:
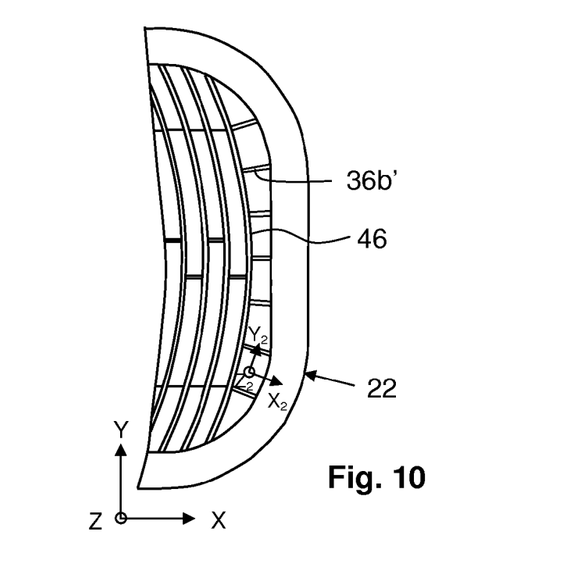
FIG. 10 shows a partial top view of a second embodiment of the support plate.

FIG. 8 shows a very schematic representation of a partial cross section taken along line C in FIG. 3 showing a couple of support bars 36b from the second set of support bars and the foil 20. The purpose is to illustrate the topographical profile of the foil 20 along the first axis Y when vacuum is applied. It can be seen that the foil 20 is bulging down in the apertures 32 between the second support bars 36b and that the dominant bending in each aperture is here made around the second axis X. Since the second support bars 36b are straight and have an extension in the second direction X, the general coordinate system may be used. However, in another preferred embodiment the bars of the second set of support bars may have another configuration. FIG. 10 shows a partial view of a second embodiment of the support plate 22 in which the second support bars 36b' are provided in a fan-shaped configuration from the third support bar 46. The support bars 36b' may in this embodiment be directed for example perpendicular to the tangent of the curved third support bar 46. The dominant bending will in this case be made around an axis $X_2$ of a local coordinate system. The axis $X_2$ should be seen as a small modification of the more general axis X.

Figure 7:
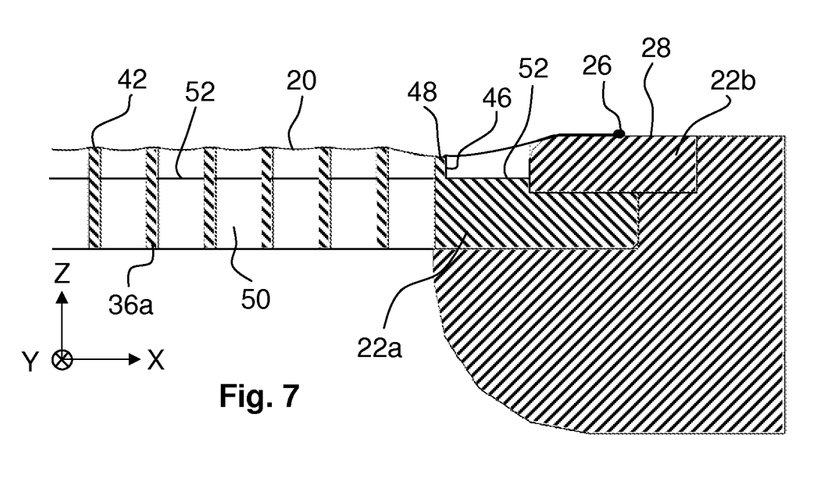
FIG. 7 shows a part of a schematic cross sectional front view of FIG. 5, the cross section being taken along line B in FIG. 3.

In order to make a smooth transition between the bending in the first and second sections 38, 40 the top surface 48 of the third support bar 46 in the interface area is low compared to the top surfaces 42 of the first support bars 36a, see FIG. 7. In this way the foil 20 in this area will not be as tensioned and will not be forced over a support bar at the same time as being forced to shift from one dominant bending to another. This is also the reason why the second support bars 36b are sloping with its lowest height towards the first support bars 36a.

Figure 5:
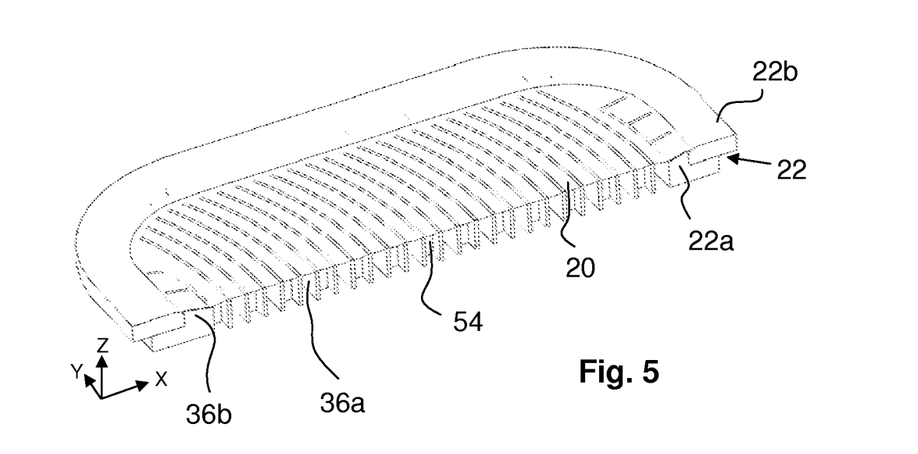
FIG. 5 shows a schematic isometric partly cross sectional view of the support plate and the foil, the foil being shown as being subjected to vacuum from inside the (not shown) housing.
Figure 6:
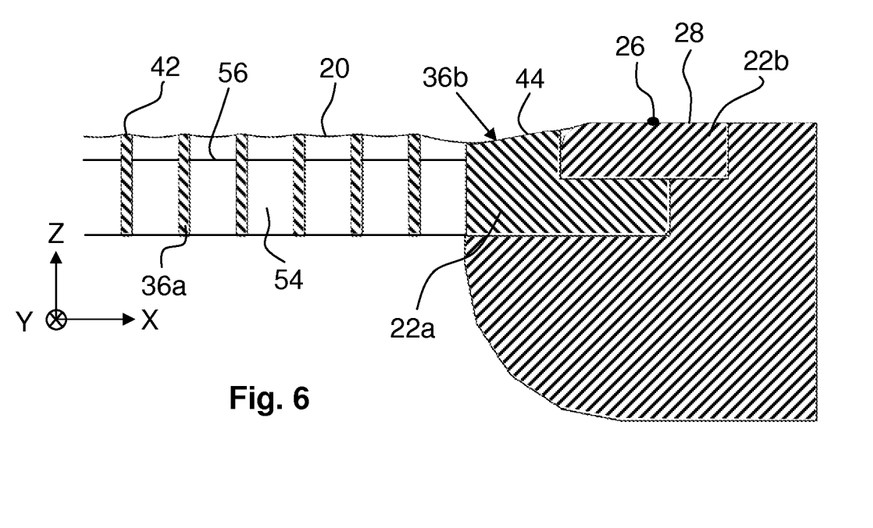
FIG. 6 shows a part of a schematic cross sectional front view of FIG. 5, the cross section being taken along line A in FIG. 3.

From FIGS. 5-8, but especially with reference to FIG. 5, it is seen that the foil 20 will not lay straight on the support plate 22 but that it will form a topographical profile substantially absorbing any surplus foil.

Figure 11:
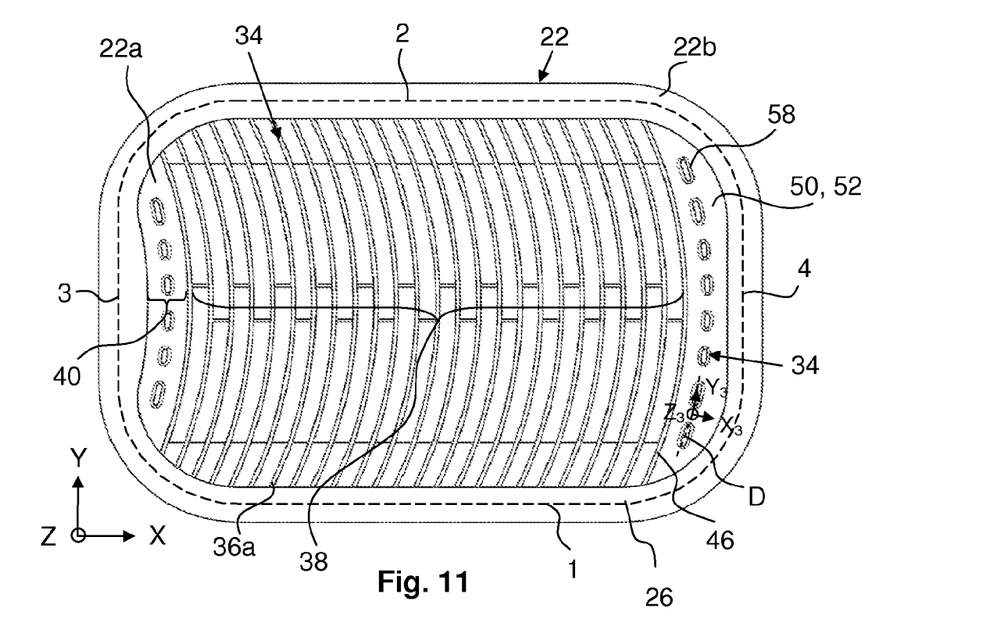
FIG. 11 shows a schematic top view of a support plate according to a third embodiment.
Figure 12:
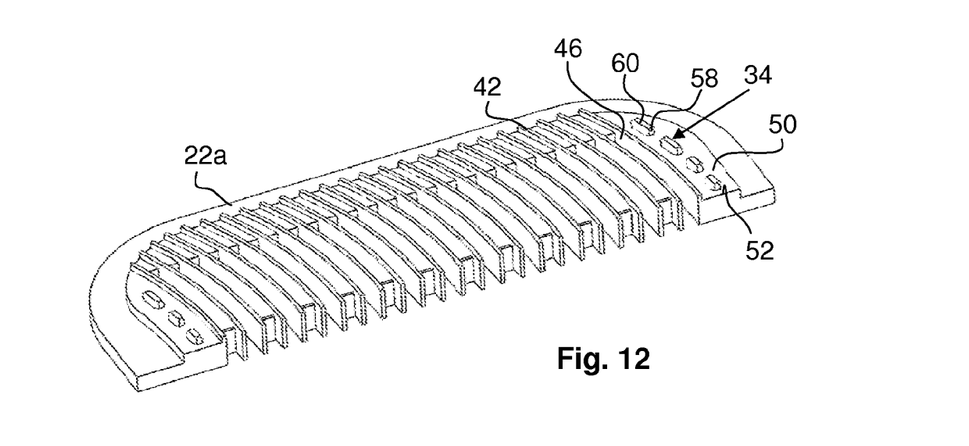
FIG. 12 shows the first support plate member of the support plate of FIG. 11 but in an isometric partly cross sectional view.
Figure 13:
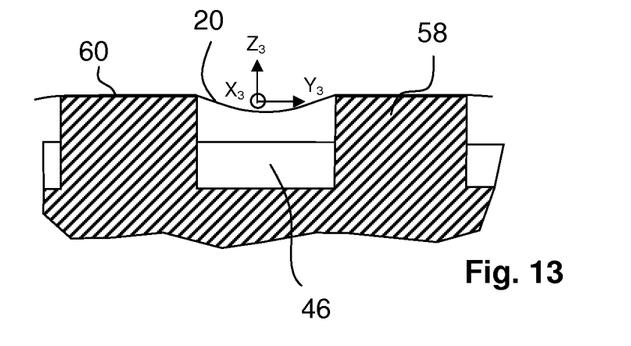
FIG. 13 shows a very schematic representation of a partial cross section taken along line D in FIG. 11.

FIGS. 11-13 show a third preferred embodiment of the support plate 22. In this embodiment, like in the first and second embodiments, the dominant bending in a first central section 38 is made around the first axis Y and the dominant bending in second side sections 40 is made around the second axis X. The first central section 38 comprises foil support portions 34 in the form of first support bars 36a like the ones that have been previously described with reference to the first and second embodiments. Overall, the design in the first central section 38 is at least substantially the same as in the previously described first and second embodiments. Further, the third section, being the small interface area between the first and second sections comprising the third support bar 46, is also substantially the same as has been previously described. The interconnection area 50 with its top surface 52, extending over both the first and second sections 38, 40, is also the same in this third embodiment as in the previously described embodiments. However, the design and distribution of the foil support portions 34 in the second side sections 40 substantially differs from the earlier described. The second side sections 40 each comprises foil support portions being oblong-shaped elements 58. Said oblong-shaped elements 58 are positioned on the top surface 52 of the interconnection area 50 and have a top surface 60 being on the same height as the top surfaces 42 of the first support bars 36a. Further, said oblong-shaped elements 58 are arranged separated from each other in a row. Said row of elements 58 extend along a curved path. The curved path is being arc-shaped. The arc-shape substantially corresponds to the arc-shape of the first and third support bars 36a, 46. Thus, the row of oblong-shaped elements 58 may in a sense be regarded as forming an additional support bar corresponding to the first and third support bars 36a, 46. Each oblong-shaped element 58 has its longest extension, its length, following along the arc. The length of each element 58 may be the equal or may differ between the elements 58. In the shown example the elements 58 in the ends of the arc are longer than in the middle of the arc. The length interval is preferably between 2-4 mm. The thickness of the elements 58 in a direction perpendicular to the lengthwise direction is about 1.6 mm.

As mentioned, the dominant bending in the second side sections 40 is made around the second axis X. More specifically, the dominant bending will in this case be made around an axis $X_3$ of an arbitrary local coordinate system. The axis $X_3$ should be seen as a small modification of the more general axis X. The axis $Y_3$ is directed along the curved path, and the axis $X_3$ is directed substantially perpendicular to the tangent of the curved path. To obtain the desired dominant bending the distance, or gap, between subsequent elements 58 in the row is substantially equal to or longer than the distance from the elements 58 to the third support bar 46 and the distance from the elements 58 to the frame constituting the second support plate member 22*b*. If the distances are equal, the dominant bending will still be created around the axis $X_3$ since wrinkles are more likely to occur perpendicular to the bonding line 26, in this case perpendicular to the sides 3 and 4 of the rectangle. For better understanding the bonding line 26 has been added in FIG. 11. FIG. 13 shows a very schematic representation of a partial cross section taken along line C in FIG. 11, i.e. along the curved path along which the oblong-shaped elements 58 are arranged. The figure shows a couple of oblong-shaped elements 58 and the foil 20. The purpose is to illustrate the topographical profile of the foil 20 over the oblong-shaped elements 58 when vacuum is applied. It can be seen that the foil 20 is bulging down in the gaps between the oblong-shaped elements 58 and that the dominant bending in each gap is here made around the second axis X.

The present invention also comprises a method which to a large extent has already been described in relation to the assembly. The method comprises the step of providing, within said area, a pattern of apertures 32 and foil support portions 34 alternately in the support plate 22, which pattern, when vacuum is created in the housing 14, is being adapted to form a topographical profile of the foil 20 substantially absorbing any surplus foil. Preferably, in such a way that a substantially dominant bending of the foil 20 occurs in each aperture 32.

The invention further comprises a method in a filling machine for sterilizing packaging material such as for example a packaging material web. Said method comprises the step of using an electron beam generating device, of the kind initially described with reference to FIG. 1, comprising an assembly according to the invention. The packaging material web, to be used when forming food packages, may comprise a packaging laminate comprising a core layer of paper and inner and outer layers of polymers. Before forming the web into packages the web is to be sterilized by means of an electron beam generating device 10. The electron beam generating device 10 includes an assembly of the previously described type.

An electron beam generating device having an assembly of the previously described type may also be used for sterilizing the outside surface of a packaging container. Preferably, the electron beam generating device is directed towards the side of the packaging container and the packaging container is rotated in order for the sterilization to be made on the entire outside surface.

An electron beam generating device adapted for sterilizing a conventional web of packaging material will have a more rectangular shaped electron exit window assembly than has been presented in the figures. In fact, the transparent centre portion of the assembly, i.e. the portion through which the electrons are able to pass is about 40 mm long (in the first direction Y) and about 400 mm wide (in the second direction X). However, the overall design of the support plate 22 will not substantially differ in a more rectangular shaped assembly. Due to the larger width the first section 38 of support bars will be larger with more first support bars 36*a*.

During sterilization the web of packaging material will pass the electron exit window 12 of the electron generating device 10. The running direction of the web will correspond to the first direction Y, i.e. the running direction and the first direction Y are aligned.

Although the present invention has been described with respect to a presently preferred embodiment, it is to be understood that various modifications and changes may be made without departing from the object and scope of the invention as defined in the appended claims.

The first support bars 36*a* have been described as extending along curved paths, and being arc-formed in the presently preferred embodiment. Another way of describing the curved path is to use the mathematical term polynomial. The arc shown in for example FIG. 3 is polynomial of the $2^{nd}$ order. In certain applications the heat expantion in the support bars of the support plate will be in focus and it is desired to minimize the effects of the heat expantion. In those cases alternative designs of the support bars include for example polynomials of the $3^{rd}$ and $4^{th}$ order. Interconnecting portions between the support bars may be provided in the axis intersection points of the polynomial.

The invention claimed is:

1. An assembly of a support plate and an exit window foil for use in an electron beam generating device, said support plate reducing wrinkles in said foil, which wrinkles may arise due to surplus foil arising in the assembly process, said foil being bonded to the support plate along a closed bonding line bounding an area in which the support plate is provided with apertures and foil support portions and in which area the foil is adapted to serve as a portion of a wall of a vacuum tight housing of the electron beam generating device, the support plate, within said area, is provided with a pattern of apertures and foil support portions alternately, which pattern, when vacuum is created in the housing, is being adapted to form a topographical profile of the foil substantially absorbing any surplus foil, wherein the absorption is made in such a way that a substantially dominant bending of the foil occurs in said apertures, the dominant bending being made around an axis directed substantially perpendicular to the bonding line in a plane of the support plate.

2. Assembly according to claim 1, wherein the area bounded by said bonding line is divided in at least two sections each comprising at least one aperture, and that in each respective section the dominant bending is created in the same direction in neighboring apertures.

3. Assembly according to claim 1, wherein the bonding line is positioned on a plateau of the support plate.

4. Assembly according to claim 1, wherein the area bounded by the bonding line is substantially rectangular, and that the dominant bending in a first central section is made around a first axis directed substantially perpendicular to a first side of the rectangle and to a second side opposite the first side, and that the dominant bending in second side sections is made around a second axis directed substantially perpendicular to a third side and respective fourth side of the rectangle, the third and fourth sides of the rectangle being substantially perpendicular to the first and second sides.

5. Assembly according to claim 4, wherein the foil support portions are formed as foil support bars.

6. Assembly according to claim 4, wherein the foil support portions in the second side sections are elements arranged separated from each other in a row, said row substantially following the first axis.

7. Assembly according to claim 5, wherein a first set of foil support bars are provided in the first central section of the support plate, and that a second set of support bars is provided in the second side section, wherein such a second side section is provided one on each side of the first section in end regions of the support plate.

8. Assembly according to claim 7, wherein the support bars of the first set of support bars extend along the first axis directed substantially perpendicular to the first and second sides of the rectangle.

9. Assembly according to claim 8, wherein the foil support bars of the first set of foil support bars extend along curved paths.

10. Assembly according to claim 7, wherein the support bars of the second sets of foil support bars extend along the second axis directed substantially perpendicular to the third side and respective fourth side of the rectangle.

11. A method for reducing wrinkles in an exit window foil of an electron beam generating device, which wrinkles may arise due to surplus foil arising in the assembly process, said foil being bonded to a support plate along a closed bonding line bounding an area in which the support plate is provided with apertures and foil support portions and in which area the foil is adapted to serve as a portion of a wall of a vacuum tight housing of the electron beam generating device, the method comprising providing, within said area, a pattern of apertures and foil support portions alternately in the support plate, which pattern, when vacuum is created in the housing, is being adapted to form a topographical profile of the foil substantially absorbing any surplus foil, wherein the absorption is made in such a way that a substantially dominant bending of the foil occurs in said apertures, the dominant bending being made around an axis directed substantially perpendicular to the bonding line in a plane of the support plate.

12. An assembly of a support plate and an exit window foil for use in an electron beam generating device, the support plate reducing wrinkles in the foil, which wrinkles may arise due to surplus foil arising in the assembly process, the foil being bonded to the support plate along a close bonding line bounding an area in which the support plate is provided with apertures and foil support portions and in which area the foil is adapted to serve as a portion of a wall of a vacuum tight housing of the electron beam generating device, the area in which the support plate is provided with apertures and foil support portions including a central section and a side section disposed on the side of the central section, the support plate, within the central section and the side section, is provided with a pattern of apertures and foil support portions alternately, which pattern, when vacuum is created in the housing, is being adapted to form a topographical profile of the foil substantially absorbing any surplus foil, wherein the absorption is made in such a way that a substantially dominant bending of the foil occurs in the apertures, the dominant bending being made around an axis directed substantially perpendicular to the bonding line in a plane of the support plate in both the central section and the side section, and the foil support portions in the central section being substantially perpendicular to the foil support portions in the side section.

* * * * *